United States Patent
Castro

(10) Patent No.: US 9,608,579 B2
(45) Date of Patent: Mar. 28, 2017

(54) APPARATUS AND METHODS FOR PARALLELING AMPLIFIERS

(71) Applicant: Analog Devices, Inc., Norwood, MA (US)

(72) Inventor: Gustavo Castro, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/676,470

(22) Filed: Apr. 1, 2015

(65) Prior Publication Data

US 2016/0294338 A1    Oct. 6, 2016

(51) Int. Cl.
*H03F 3/68*     (2006.01)
*H03F 3/183*    (2006.01)

(52) U.S. Cl.
CPC ......... *H03F 3/183* (2013.01); *H03F 2200/03* (2013.01); *H03F 2200/135* (2013.01)

(58) Field of Classification Search
CPC . H03F 3/183; H03F 2200/03; H03F 2200/135
USPC ................. 330/84, 69, 98, 99, 100
See application file for complete search history.

(56) References Cited

PUBLICATIONS

Jung, et al., "Op Amp Applications Handbook," Elsevier, 2005, Chapter 6, pp. 473.*

AD815—High Output Current Differential Driver, Analog Devices, 2015, 15 pages.
AN-32 Using Evaluation Kits to Implement Parallel Operation, http://www.powerampdesign.net/images/AN-32_Using_Evaluations_Kits_to_Implement_Parallel_Operation.pdf. 10 pages.
AN-272 Op Amp Booster Designs, Application Report, Sep. 1981 (revised Apr. 2013), 16 pages, Texas Instruments.
Application Note, "Doubling the output of current to a load with a dual op amp," Intersil Americas Inc., May 25, 2005, AN1111.1, 1 page.
"High Performance Quad Headphone Buffer," Jul. 15, 2013, http://www.jensign.com/S4/quadbuffer.html, 7 pages.
Monophonic Power Amplifier M-8000, Accuphase Laboratory Inc., http://www.accuphase.com, 4 pages.
Kyriakakis, Joe, "Boosting output in high-voltage op-amps with a current buffer," Power Systems Design: Empowering Global Innovation, Feb. 18, 2014, 8 pages.
Monks, Morgan, "Double the output current to a load with the dual OPA2604 audio op amp," Burr-Brown® Application Bulletin, Mar. 1993, 2 pages.

(Continued)

*Primary Examiner* — Steven J Mottola
*Assistant Examiner* — Hafizur Rahman
(74) *Attorney, Agent, or Firm* — Knobbe, Martens, Olson & Bear, LLP

(57) ABSTRACT

Provided herein are apparatus and methods for low distortion composite amplifiers with high load current. In certain configurations, a composite amplifier can be a closed loop system which includes two or more amplifiers such that one or more amplifiers can provide an output current to a load while one or more amplifiers can control an output voltage to be proportional to an input voltage. The loop gain can be proportional to the product of the individual amplifier gains and to a noise gain network function. In this way the composite amplifier can maintain low distortion for heavier loads and for load currents which exceed the normal load current operation of a single amplifier.

20 Claims, 7 Drawing Sheets

(56) References Cited

PUBLICATIONS

"Using a transistor to add to max current output from a opamp?," http://electronics.stackexchanqe.com/questions/71870/using-a-transistor-to-add-to-max-current-output-from-a-opamp, printed Jun. 29, 2015, 3 pages.

Williams, Jim, "Boost op-amp output without sacrificing drift and gain specs," Designer's Guide to: Op-amp booster stages—Part 1, EDN, May 29, 1986, pp. 131-144.

Williams, Jim, "Power gain stages for monolithic amplifiers," Linear Technology, Application Note 18, Mar. 1986, 16 pages.

Jung, et al., "Op Amp Applications Handbook," Elsevier, 2005, Chapter 6, p. 6.168.

Jung, et al., "Op Amp Applications Handbook," Elsevier, 2005, Chapter 6, p. 6.57.

Wong, James, "A Collection of Amp Applications," AN-106 Application Note, Analog Devices, 17 pages, publication date unknown [online], [retrieved on Jun. 29, 2015]. Retrieved from the Internet <http://www.analog.com/media/en/technical-documentation/application-notes/28080533AN106.pdf>.

\* cited by examiner

APPARATUS AND METHODS FOR PARALLELING AMPLIFIERS

BACKGROUND

Field

Embodiments of the invention relate to electronic systems, and more particularly, to composite amplifiers.

Description of the Related Technology

An amplifier can be used with a feedback network to provide an output voltage and an output current to a load. The load can be a headphone, for instance, and the feedback network can be a resistor divider.

In one example, an amplifier can be a high gain operational amplifier having both an inverting and noninverting input. The operational amplifier can be used in a closed loop system to provide an output voltage and an output current. The output current can be dependent upon the load, and the output voltage can be proportional to the input voltage.

SUMMARY

In one embodiment, an apparatus includes a first amplifier and a second amplifier which has a non-inverting input node and an inverting input node. The apparatus also includes a first conductive path, a second conductive path, a third conductive path, a fourth conductive path, and a fifth conductive path. The first conductive path is configured to connect an output of the first amplifier to an output node. The second conductive path is configured to connect an output of the second amplifier to the output node. The third conductive path is configured to provide at least a portion of the output of the first amplifier as an input to the non-inverting input node of the second amplifier. The fourth conductive path is configured to provide at least a portion of the output of the second amplifier as an input to the inverting input node of the second amplifier; and the fifth conductive path is configured to provide conductance between the non-inverting input and the inverting input of the second amplifier, wherein the fifth conductive path comprises at least one passive component.

The apparatus can include an integrated circuit, wherein the first amplifier and the second amplifier comprise identical instances of an operational amplifier, wherein both the first amplifier and the second amplifier are part of the integrated circuit.

The fifth conductive path can comprise at least one resistor. Each of the first through fifth conductive paths can comprise at least one resistor, and a resistance of the fifth conductive path can be less than a combined resistance of the third conductive path and the fourth conductive path. Each of the first through fifth conductive paths can comprise at least one resistor, and a resistance of the fifth conductive path can be less than a resistance of the fourth conductive path.

Each of the first conductive path, the second conductive path, the third conductive path, and the fifth conductive path, can comprise at least one resistor, wherein a resistance of the fifth conductive path is less than a resistance of the third conductive path. At least one of the third or the fourth conductive paths can comprise an impedance element that is not a short circuit.

The apparatus can further comprising a feedback network configured to determine a closed-loop gain characteristic.

In another aspect the first amplifier is further configured to provide an error current at the output node of the first amplifier. The second amplifier is further configured to provide a buffer current at the output node of the second amplifier; and the first and second amplifiers are configured to provide a load current to a load electrically connected to the output node of the second amplifier.

The feedback network can be configured to provide shunt feedback. The feedback network can be configured to provide a closed loop gain less than or equal to one.

The apparatus can comprise an audio device, wherein the first amplifier and the second amplifier are configured to drive an audio transducer.

In another embodiment, a method of paralleling amplifiers comprises: providing at least a portion of an output signal of a first amplifier to a non-inverting input of a second amplifier; combining an output of a first amplifier and an output of a second amplifier to generate an output signal at an output node; and passively conducting current between the non-inverting input of the second amplifier and an inverting input of the second amplifier. The first amplifier and the second amplifier can be identical instances of an operational amplifier from an integrated circuit.

The method can comprise passively conducting current with at least one resistor. The method can comprise passively conducting current with a first conductive path, a second conductive path, a third conductive path, a fourth conductive path, and a fifth conductive path, wherein a resistance of the fifth conductive path is less than a combined resistance of the third and the fourth conductive paths.

The method can include passively conducting current with a first resistance between the non-inverting input of the second amplifier and the inverting input of the second amplifier, and the first resistance can be less than a combined resistance of a first path and a second path. The first path is between the output of the first amplifier and the non-inverting input node of the second amplifier. The second path is between the output of the second amplifier and the inverting input node of the second amplifier The method can include passively conducting current with a first resistance between the non-inverting input of the second amplifier and the inverting input of the second amplifier, and the first resistance can be less than a resistance of a path between the output of the first amplifier and the non-inverting input node of the second amplifier.

The method can include passively conducting current with a first resistance between the non-inverting input of the second amplifier and the inverting input of the second amplifier, and the first resistance can be less than a resistance of a path between the output of the second amplifier and the inverting input node of the second amplifier.

The method can further comprise driving an audio transducer with the first amplifier and the second amplifier.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1A:
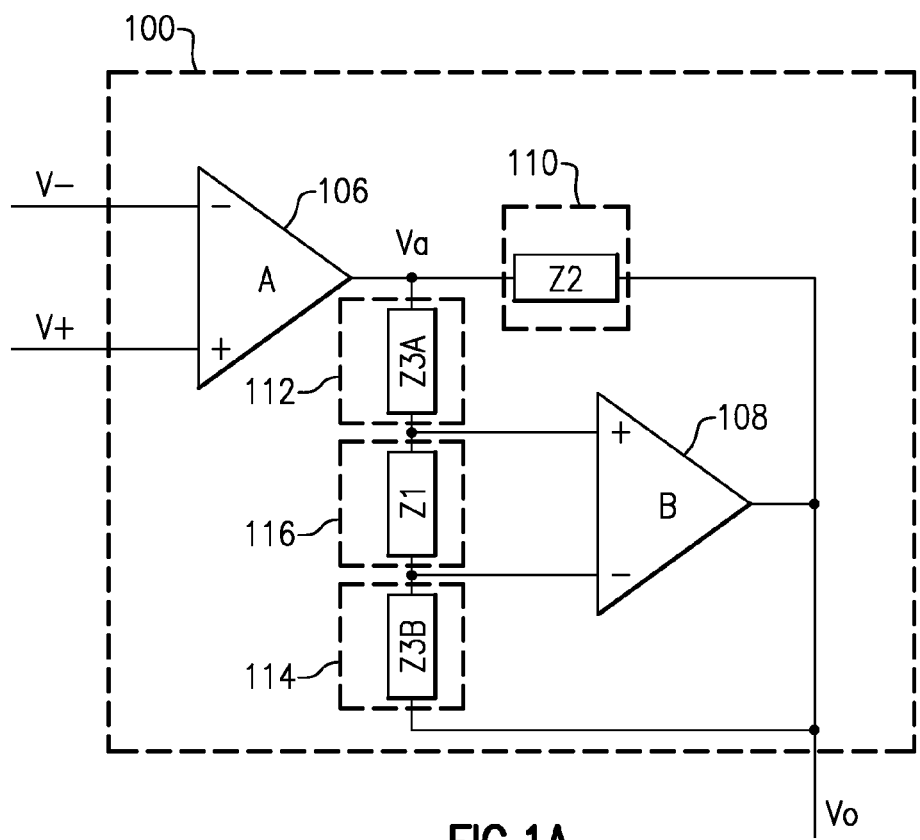
FIG. 1A is a schematic diagram of a composite amplifier according to one embodiment of the invention.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

An amplifier can be used as a gain element in a closed loop system to provide an undistorted output voltage from an input voltage. The closed loop gain defining the relationship between an input voltage $V_{in}$ and an output voltage $V_O$ of an amplifier with a feedback network can be given by the proportionality Equation 1:

$$\frac{V_O}{V_{in}} \propto \frac{A_O}{1 + A_O \beta} \quad \text{Eq. 1}$$

where $A_O$ is the amplifier gain and $\beta$ is the feedback network transfer function, which can depend on components, such as resistors, capacitors, and the like. Also, the reciprocal of the feedback network transfer expression $\beta$ is referred to as the noise gain $G_n$ and the product of the amplifier gain $A_O$ and $\beta$ is the loop gain $A_O \beta$. The importance of loop gain, noise gain, and the feedback network transfer expression $\beta$ in realizing stable closed-loop operational-amplifier designs can be found in the reference Jung, Walt, *Op Amp Applications Handbook.* (pp. 23-29) New York: Elsevier, 2005. Analog Dialogue.

When the amplifier gain $A_O$ is relatively large, Equation 1 shows that the output voltage $V_O$ can be proportional to the input voltage $V_{in}$ and that the output voltage $V_O$ can have a relatively weak dependence upon the amplifier gain $A_O$. In this case, the output voltage $V_O$ can be relatively undistorted and can have a relatively linear relationship with the input voltage $V_{in}$. However, the amplifier gain $A_O$ depends upon the amplifier output current, which in turn depends upon the load. When the load becomes heavy, demanding a relatively large load current, then the amplifier gain $A_O$ can decrease causing the relationship between $V_O$ and $V_{in}$ to have more dependence upon the amplifier gain $A_O$. In that case, the output voltage $V_O$ can be distorted by the nonlinear characteristics of the amplifier gain $A_O$ and other factors.

Accordingly, limitations in the amplifier gain $A_O$ as a function of load current can cause distortion; and distortion can be unacceptable for certain applications and/or systems.

Provided herein are apparatus and methods for low distortion composite amplifiers with relatively high load current. In certain configurations, a composite amplifier can be a closed loop system which includes two or more amplifiers such that one or more amplifiers can provide the majority of an output current to a load while one or more other amplifiers can primarily control an output voltage to be proportional to an input voltage. In controlling the output voltage to be proportional to the input voltage, an error current is provided to internal impedances to generate an error voltage. In addition, the error current can be relatively small compared to the output current for moderate loads. The loop gain can be proportional to the product of the individual cascaded amplifier gains and to a noise gain network function. In this way, the composite amplifier can maintain relatively low distortion for heavier loads and for load currents which exceed the normal load current operation of a single amplifier.

In certain configurations, the amplifiers can correspond to operational amplifiers (op-amps). For instance, two op-amps from a dual op-amp integrated circuit (IC) can be used in realizing a composite amplifier. Using op-amps from a dual op-amp IC or a quad op-amp IC can be a cost effective and space saving strategy for implementing an amplifier on a compact printed circuit board (PCB) with more current driving capacity than is normally available from an op amp. For instance, two op-amps from a dual op-amp IC can be used to realize a composite amplifier offering low distortion at twice the output current rating of an individual op-amp.

FIG. 1A is a schematic diagram of a composite amplifier 100 according to one embodiment of the invention. The composite amplifier includes a first amplifier A 106 and a second amplifier B 108. In FIG. 1A both the first amplifier A 106 and the second amplifier B 108 are drawn as ideal differential-input amplifiers having an inverting input node, a noninverting input node, and an output node. The output voltage of a differential-input amplifier is given by an amplifier gain multiplied times the difference between a voltage at the noninverting input node and a voltage at the inverting input node.

In addition, the composite amplifier 100 can include a first conductive path 110 with impedance Z2 electrically connected between the output node of the second amplifier B 108 and the output node of the first amplifier. The output node of the second amplifier B 108 can be the output node the composite amplifier 100; however, in other embodiments a second conductive path, including elements such as resistors, can exist between the output node of the second amplifier B 108 and the output node of the composite amplifier 100.

As shown in FIG. 1A, the composite amplifier 100 can also include a third conductive path 112 with an impedance Z3A, a fourth conductive path 114 with an impedance Z3B, and a fifth conductive path 116 with an impedance Z1. The third conductive path 112 has a first node electrically connected to the output node of the first amplifier A 106 and a second node. The fourth conductive path 114 has a first node electrically connected to the output node of the second amplifier B 108 and a second node. The fifth conductive path 116 has a first node electrically connected to the second node of the third conductive path 112 and a second node electrically connected to the second node of the fourth conductive path 114. The noninverting input node of the second amplifier B 108 is also connected to the second node of the third conductive path 112 while the inverting input node of the second amplifier B 108 is connected to the second node of the fourth conductive path 114.

The first conductive path 110, the third conductive path 112, the fourth conductive path 114, and the fifth conductive path 116 can include resistors, capacitors, and/or inductors to provide an application specific response or behavior. In certain embodiments, the first conductive path 110, the third conductive path 112, the fourth conductive path 114, and the fifth conductive path 116 can each include a resistor having an amount of resistance.

The composite amplifier 100 can be treated as a composite differential amplifier with a noninverting input node V+, an inverting input node V−, and an output node providing an output voltage $V_O$. As shown in FIG. 1A, the noninverting input node and the inverting input node of the first amplifier A 106 are the noninverting input node V+ and the inverting input node V− of the composite amplifier 100. Further, the output node of the second amplifier B 108 can be the output node the composite amplifier 100; however, in other embodiments a second conductive path, including elements such as resistors, can exist between the output node of the second amplifier B 108 and the output node of the composite amplifier 100.

The composite amplifier 100 can offer an advantage of a relatively high composite amplifier gain with more output current capability than a single amplifier. For instance, the first amplifier A 106 can have a maximum current limit $I_{limA}$ and the second amplifier B 108 can have a maximum current limit $I_{limB}$ As configured in FIG. 1A, the second amplifier B 108 can first provide a current up to $I_{limB}$ at the output node of the composite amplifier 100. After the second amplifier B 108 reaches its current limit, the first amplifier A 106 can provide additional output current, totaling up to a maximum of $I_{limA}$ plus $I_{limB}$ at the output node of the composite amplifier 100. In this configuration, the composite amplifier 100 can maintain a relatively high open loop gain while delivering a current larger than $I_{limB}$; further, by virtue of high gain, it can offer the advantage of operating in a low distortion closed loop system while delivering currents larger than $I_{limB}$ to the output node of the composite amplifier 100. When the first amplifier A 106 and the second amplifier B 108 are matched op-amps from a dual package, then $I_{limB}$ can equal $I_{limA}$; and up to two times the limit current can be provided at the output node of the composite amplifier 100 depending on the amount of resistance of the first conductive path 110 with impedance Z2.

Figure 1B:
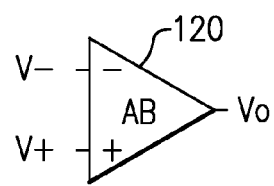
FIG. 1B is a three terminal symbolic diagram of a composite amplifier according to an embodiment of the invention.

FIG. 1B is a three terminal symbolic diagram 120 of the composite amplifier 100 according to an embodiment of the invention. The symbolic diagram 120 shows the composite amplifier 100 can be conceptually treated as a differential amplifier with the inverting input node V−, the noninverting input node V+, and the output node providing the output voltage $V_O$.

Figure 1C:
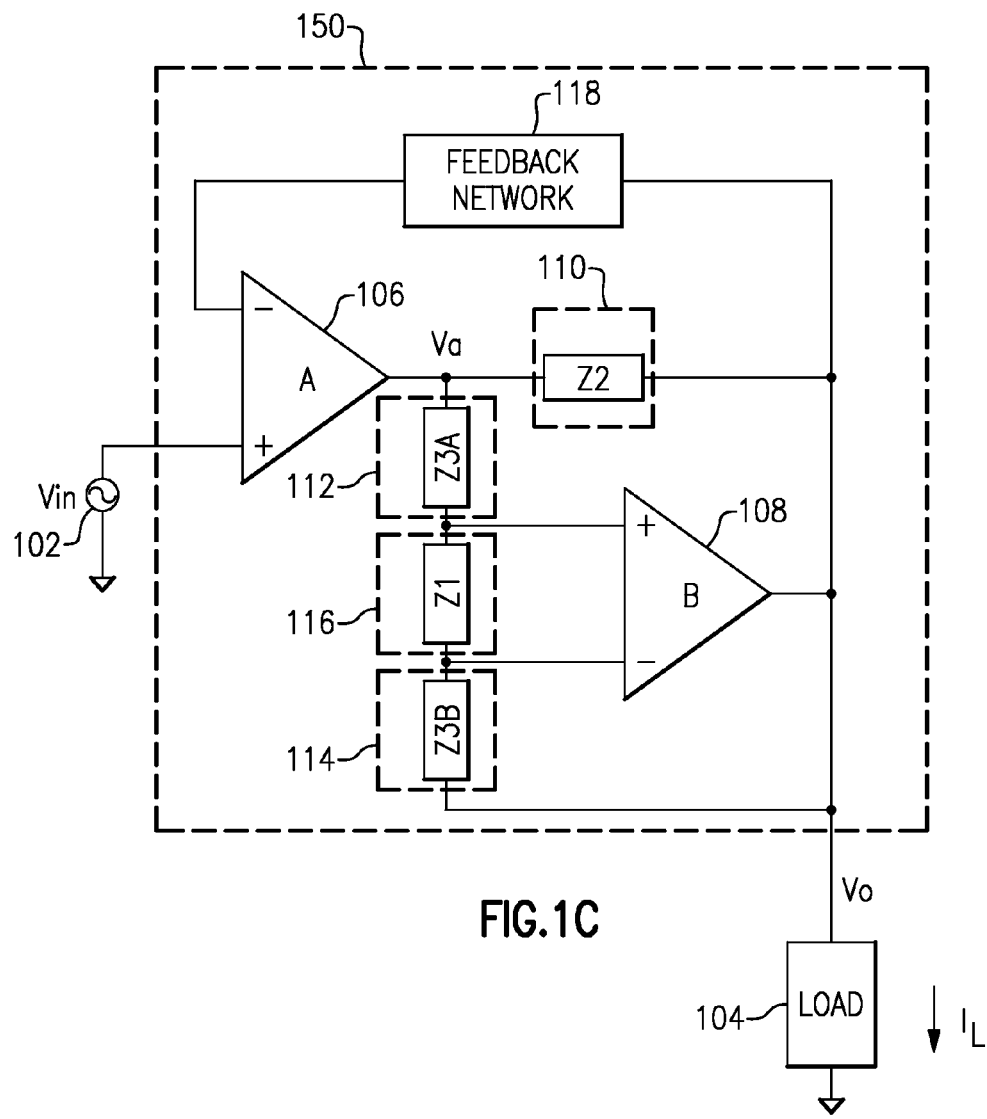
FIG. 1C is a schematic diagram of a composite amplifier including a feedback network according to another embodiment of the invention.

FIG. 1C is a schematic diagram of a composite amplifier 150 including a feedback network 118 according to another embodiment of the invention. The composite amplifier 150 is similar to the composite amplifier 100 of FIG. 1A except it is configured as a closed-loop system with the feedback network 118. The feedback network 118 is electrically connected between the output node providing output voltage $V_O$ of the composite amplifier 150 and the inverting node of the first amplifier A 106 so as to provide shunt feedback. In this manner the noninverting input node of the first amplifier A 106 can operate as the input node of the composite amplifier 150 and can receive an input voltage $V_{in}$ from an external input 102. The output node of the second amplifier B 108 can operate as the output node of the composite amplifier 150 to provide an output voltage $V_O$ proportional to the input voltage input voltage $V_{in}$. As shown in FIG. 1C, the output node of the second amplifier B can be electrically connected to a load 104. The second amplifier B 108 can also provide most of the load current $I_L$ to the load 104 when the load 104 is moderate. When the load 104 is heavy (relatively low impedance), the first amplifier A 106 can also provide some of the load current $I_L$.

The feedback network 118 can be a network of passive elements such as resistors, capacitors, and/or inductors electrically connected between the output node of the second amplifier B 108 and the inverting input node of the first amplifier A 106. For a unity gain configuration, the feedback network 118 can correspond to a short circuit. The feedback network 118 can also have an additional node electrically connected to a supply voltage or ground. The selection of components and values for the design of the feedback network 118 can be application dependent and will be readily determined by one of ordinary skill in the art. For example, details of how to design a feedback network 118 for different applications are discussed in many references, such as the Jung reference (Ibid.).

The first amplifier A 106 can provide an error current at the output node of the first amplifier A 106 such that there is a differential error voltage $V_{err}$, also referred to simply as an error voltage, between the noninverting and inverting nodes of the second amplifier B 108. The differential error voltage $V_{err}$ times a voltage gain $A_{OB}$ of the second amplifier B 108 gives rise to the output voltage $V_O$. At moderate loads where the load current $I_L$ is less than the current rating of the second amplifier B 108, the second amplifier B 108 provides most of load current $I_L$ to the load 104 while the first amplifier A 106 provides an error current to support the differential error voltage $V_{err}$. At heavy loads where the load current $I_L$ exceeds the maximum load current rating of the second amplifier B 108, the first amplifier A 106 can provide additional output current to the load 104 through the first conductive path 110. In this case, the load 104 receives load current from both the first amplifier A 106 and the second amplifier B 108.

Although the first amplifier A 106 and the second amplifier B 108 are shown as ideal amplifiers for ease of presentation, those skilled in the art of analog design can appreciate the additional connections and practical aspects of amplifiers. For instance, both the first amplifier A 106 and the second amplifier B 108 can require bias and supply voltages, and the supply voltages can be single rail or split rail and can include a ground, a positive supply, and/or a negative supply. In addition, both the first amplifier A 106 and the second amplifier B 108 can have practical design considerations such as a systematic offset voltage, a random offset voltage, and an input referenced noise voltage between the noninverting and inverting nodes (Ibid.). Moreover, the second amplifier B 108, having non-ideal voltages as described above can cause the differential error voltage $V_{err}$ to be consistent with these non-ideal voltages and the closed-loop error current provided by the first amplifier A 106.

Figure 2:
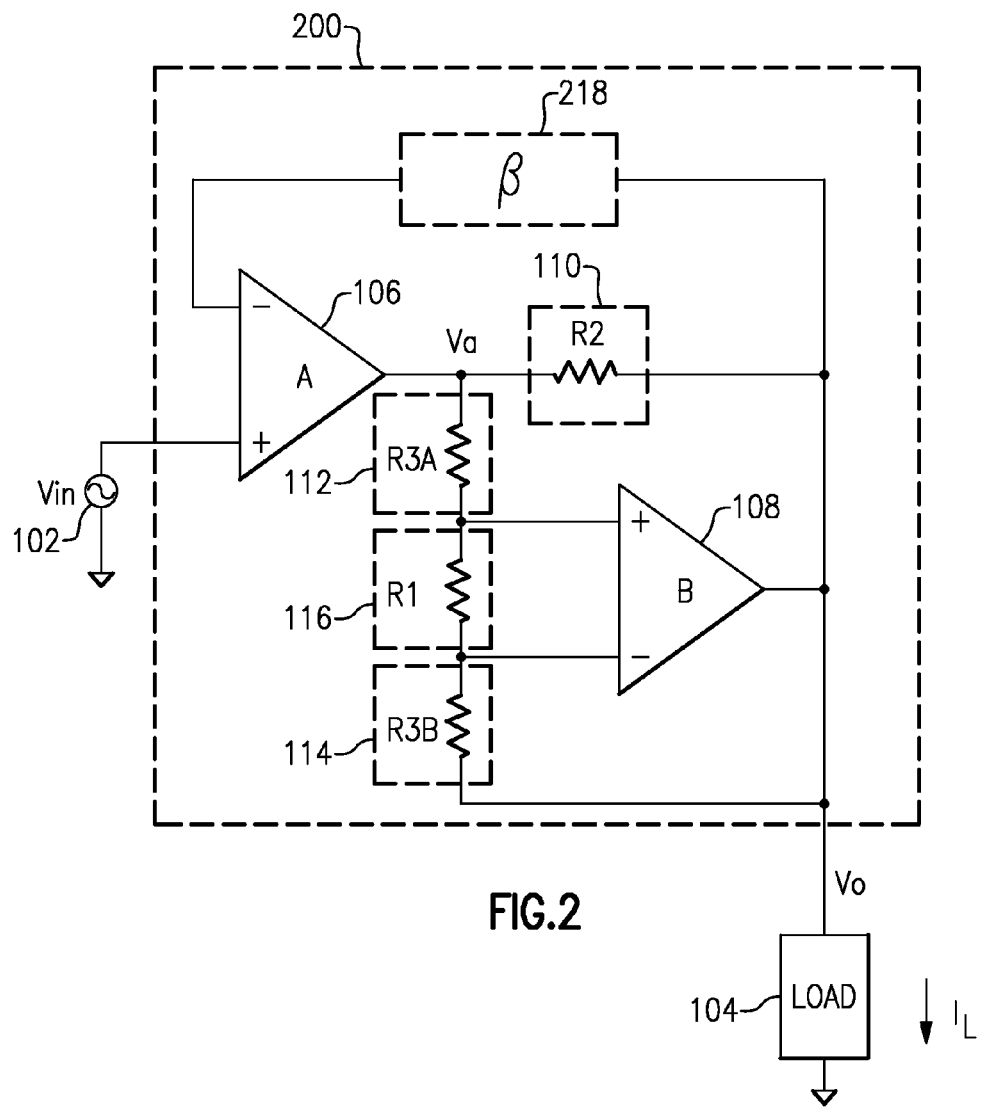
FIG. 2 is a schematic diagram of a composite amplifier according to another embodiment of the invention.

FIG. 2 is a schematic diagram of a composite amplifier 200 according to another embodiment of the invention. The composite amplifier 200 is similar to the composite amplifier 150 of FIG. 1C except the impedances are resistances: the first conductive path 110 has a resistor R2; the third conductive path 112 has a resistor R3A; the fourth conductive path 114 has a resistor R3B; and the fifth conductive path 116 has a resistor R1. Also, the feedback network 118 has been replaced by a feedback network 218 having a feedback network transfer expression β. By comparison to the composite amplifier 150 of FIG. 1C, the operation of the composite amplifier 200 is similar, and the resistors allow a simple circuit analysis.

A circuit analysis of the composite amplifier 200 of FIG. 2 begins with an analysis of the inner loop formed by resistors R1, R3A, and R3B with the second amplifier B 108. With the resistors R1, R3A, and R3B having resistance values $R_1$, $R_{3A}$, and $R_{3B}$, respectively, a noise gain $G_n$ for this inner loop is given by Equation 2.

$$G_n = 1 + \frac{R_{3A} + R_{3B}}{R_1} \quad \text{Eq. 2}$$

Notably, in the configuration of FIG. 2, Equation 2 shows the noise gain $G_n$ can be greater than unity while the signal gain $G_s$, as defined in the reference (Ibid.), can be less than or equal to unity. By superposition an output voltage $V_O$ at the output the second amplifier B 108 can be expressed by Equation 3 in terms of the differential error voltage $V_{err}$ and $G_n$.

$$V_O = V_a - V_{err} \times G_n \quad \text{Eq. 3}$$

Also, as shown in FIG. 2, the second amplifier B 108 provides the output voltage $V_O$ of the composite amplifier 200.

Another relationship for the output voltage $V_O$ of the composite amplifier 200 in terms of the feedback network transfer expression $\beta$ and a composite amplifier gain $A_{OC}$ can be determined by Equation 4 for the closed loop gain $A_{CL}$.

$$A_{CL} = \frac{V_O}{V_{in}} = \frac{A_{OC}}{1 + A_{OC}\beta} \quad \text{Eq. 4}$$

At low frequencies where the composite amplifier gain $A_{OC}$ is large, Equation 4 shows that the output voltage $V_O$ can be approximated by Equation 5.

$$V_O = V_{in}\left(\frac{1}{\beta}\right) \quad \text{Eq. 5}$$

Equation 2, Equation 3, and Equation 5 can be combined to give an expression for $V_a$.

$$V_a = V_{in}\left(\frac{1}{\beta}\right) + V_{err} \times \left(1 + \frac{R_{3A} + R_{3B}}{R_1}\right) \quad \text{Eq. 6}$$

Also, an equation for a current $I_{R2}$ flowing across resistor R2, in terms of its resistance $R_2$ can be given by Equation 7.

$$I_{R2} = \left(\frac{V_a - V_O}{R_2}\right) = V_{err} \times \left(1 + \frac{R_{3A} + R_{3B}}{R_1}\right) \times \frac{1}{R_2} \quad \text{Eq. 7}$$

Equation 7 shows the current flowing across resistor R2 is independent of the output voltage $V_O$; or said another way, resistor R2 is electrically bootstrapped. Additionally, the current $I_{R2}$ is independent of the load 104.

A current $I_a$ flowing from the output node of the first amplifier A 106 is determined by the sum of the current $I_{R2}$ flowing across resistor R2 and of the current $I_{err}$ flowing across resistor R1. Because the current $I_{err}$ flowing across resistor R1 is the differential error voltage $V_{err}$ divided by the resistance $R_1$, an equation for the current $I_a$ can be given by Equation 8.

$$I_a = V_{err}\left(1 + \frac{R_{3A} + R_{3B}}{R_1}\right)\frac{1}{R_2} + \frac{V_{err}}{R_1} = V_{err}\left(\frac{R_1 + R_2 + R_{3A} + R_{3B}}{R_1 R_2}\right) \quad \text{Eq. 8}$$

Equation 8 shows the current $I_a$ is independent of the output voltage $V_O$ and independent of the load 104. Conversely, a current $I_b$ flowing from the output node of the second amplifier B 108 can be given by Equation 9 in terms of the load current $I_L$ and the current $I_a$.

$$I_b = I_L - I_a \quad \text{Eq. 9}$$

Equation 9 shows the current $I_b$ is dependent upon the load current $I_L$ demanded by the load 104. Thus, Equation 9 gives mathematical support to the concept that the second amplifier B 108 can provide all or most of the load current while the first amplifier A 106 provides an error current $I_{err}$ keeping the resistors R2, R3A, R3B1, and R1 electrically bootstrapped.

The load can be increased to a level where it does cause the current $I_a$ to depend upon the load. When this occurs, Equation 8 can be rewritten to include a load-dependent distortion function $V_{err}(I_b)$.

$$I_a = (V_{err} + V_{err}(I_b))\left(\frac{R_1 + R_2 + R_{3A} + R_{3B}}{R_1 R_2}\right) \quad \text{Eq. 10}$$

As shown by Equation 10, distortion caused by the loading of the second amplifier B 108 can be compensated by the first amplifier A 106. In this way, the first amplifier A 106 can eliminate the load-induced distortion until the compensation current reaches a level where the gain of the first amplifier A 106 begins to decrease.

In addition to increasing the noise gain $G_n$, the resistors R3A and R3B can provide protection by limiting input current to the inverting and noninverting inputs of the second amplifier B 108. In practical amplifiers, such as operational amplifiers, the noninverting and inverting inputs can be damaged due to reverse breakdown when electrically connected to low-impedance nodes such as the output of an operational amplifier. Resistors R3A and R3B can, therefore, protect the inverting and noninverting inputs of the second amplifier B 108 from the low-impedance output node of the first amplifier A 106 and the low impedance output node of the second amplifier B 108. In some embodiments where the noninverting and inverting inputs of the first amplifier A 106 and/or the second amplifier B 108 do not require protection from low impedance nodes, either resistor R3A, R3B, or both can be excluded. For instance, in one embodiment the third conductive path 112 can be a short while the fourth conductive path 114 can include the resistor R3B. In that case, the inverting input of the second amplifier B 108 can be connected directly to the output node.

Figure 3:
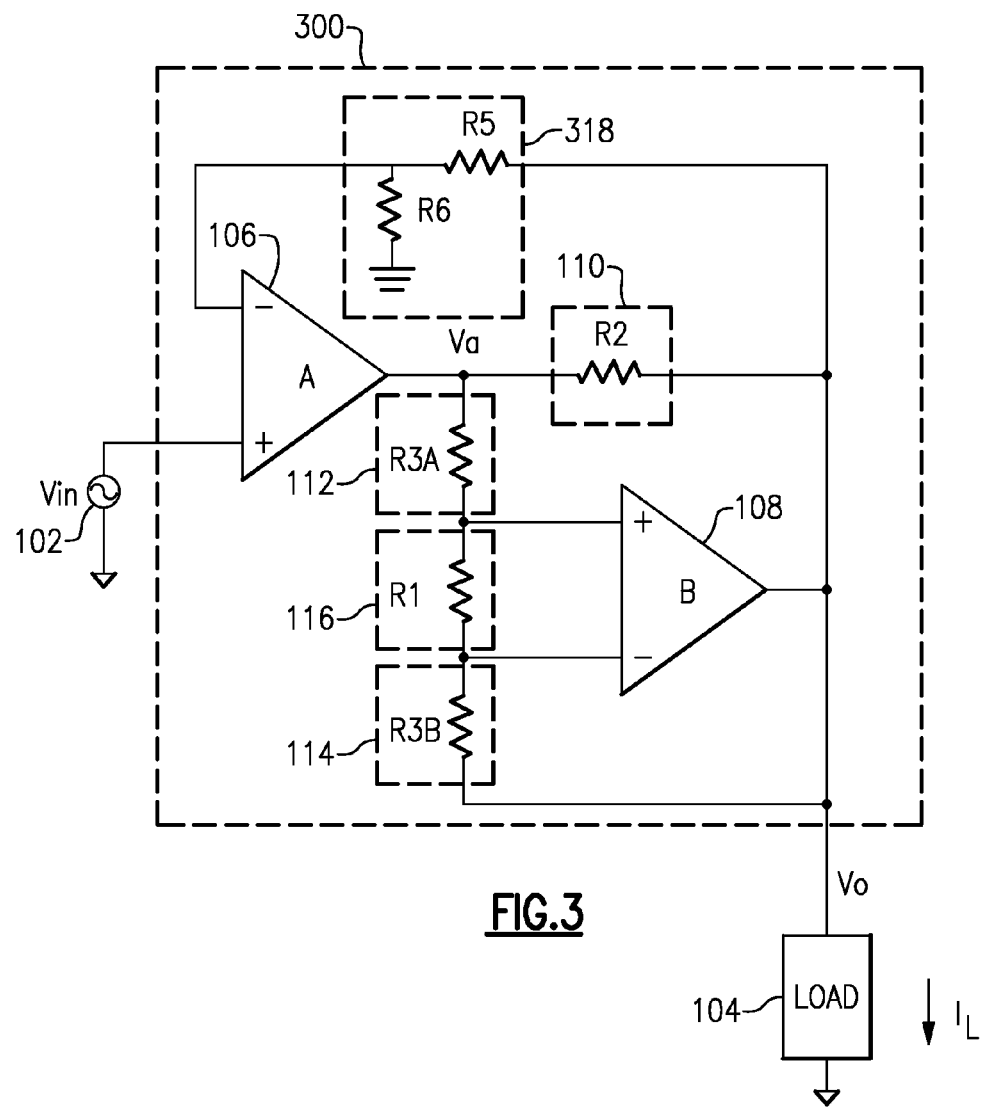
FIG. 3 is a schematic diagram of a composite amplifier according to another embodiment of the invention.

FIG. 3 is a schematic diagram of a composite amplifier 300 according to another embodiment of the invention. The composite amplifier 300 is also similar to the composite amplifier 200 of FIG. 2 except the feedback network 118 has been replaced with a feedback network 318. Resistor R6 is electrically connected between ground and the inverting node of the first amplifier A 106 while resistor R5 is electrically connected between the output node of the composite amplifier 300 and the inverting node of the first amplifier A 106. The feedback network 318 provides a feedback network transfer expression $\beta$ in terms of the resistances $R_5$ and $R_6$ of resistors R5 and R6, respectively.

$$\beta = \left(\frac{R_6}{R_5 + R_6}\right) \quad \text{Eq. 11}$$

Although FIG. 3 shows one embodiment of a composite amplifier 300 having simple feedback 318, others are possible. The reference by Jung (Ibid.) provides more details on a variety of possible feedback networks.

Figure 4A:
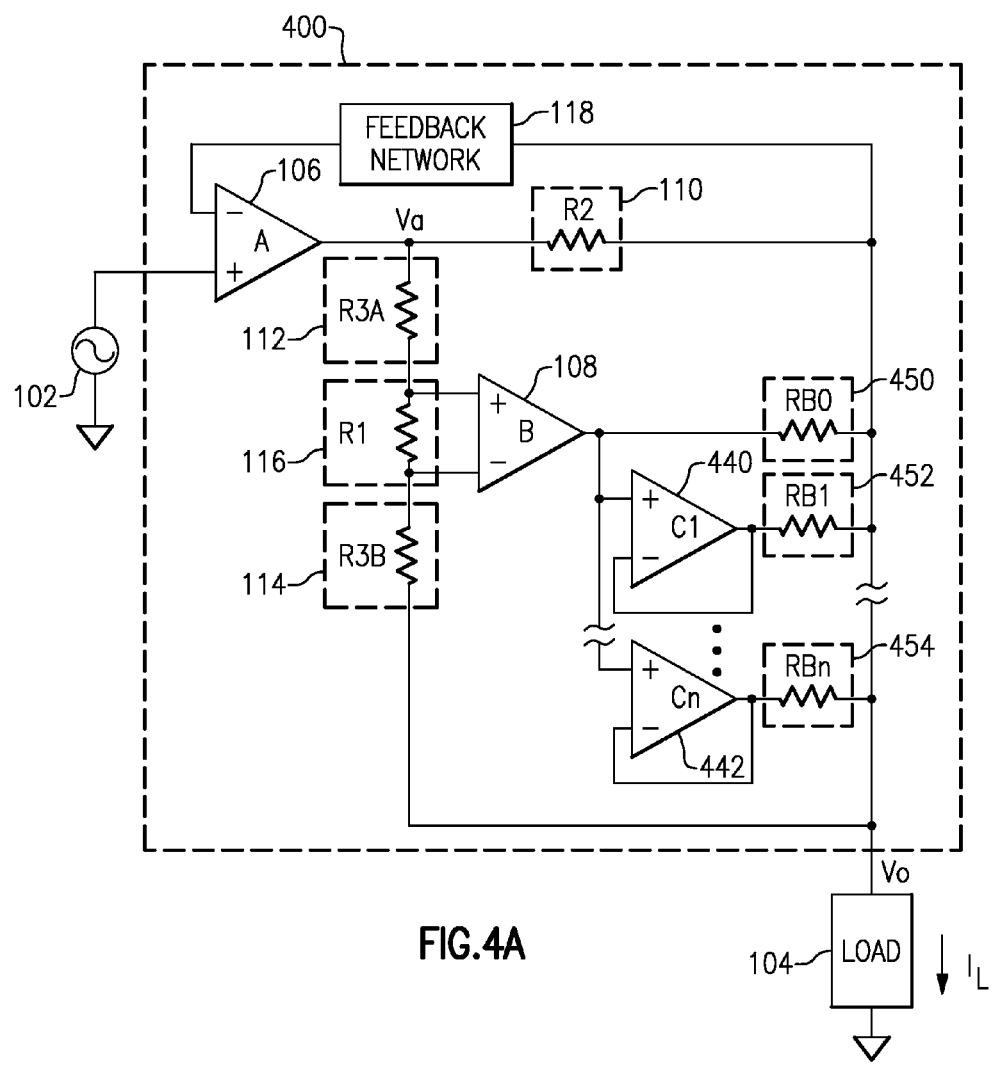
FIG. 4A is a schematic diagram of a composite amplifier according to another embodiment of the invention.

FIG. 4A is a schematic diagram of a composite amplifier 400 according to another embodiment of the invention. The composite amplifier 400 is similar to the composite amplifier 200 of FIG. 2; however, additional components and conductive paths are included between the output node of the second amplifier B 108 and the output node of the composite amplifier 400. The composite amplifier 400 includes a third amplifier C1 440 through an n-th amplifier Cn 442 each having a noninverting node electrically connected to the output of the second amplifier. An inverting node of the third amplifier C1 440 is electrically connected to the output node of the third amplifier C1 440; and an inverting node of the n-th amplifier Cn 442 is electrically connected to the output node of the n-th amplifier Cn 442. The composite amplifier 400 also includes a sixth conductive path 450 having a first node electrically connected to the output node of the second amplifier B 108 and a second node electrically connected to the output node of the composite amplifier 400. The sixth conductive path 450 can include a resistor RB0. The composite amplifier 400 additionally includes a seventh conductive path 452 having a first node electrically connected to the output node of the third amplifier C1 440 and a second node electrically connected to the output node of the composite amplifier 400; the seventh conductive path 452 can include a resistor RB1. The composite amplifier 400 can further include an eighth conductive path 454 having a first node electrically connected to the output node of the n-th amplifier Cn 442 and a second node electrically connected to the output node of the composite amplifier 400; the eighth conductive path 454 can include a resistor RBn.

The third amplifier C1 440 through the n-th amplifier Cn 442 can operate as parallel buffers providing current at their respective output nodes, and thus can share the load current $I_L$ demanded by the load 104. The current provided from the output node of the second amplifier B 108 to the load 104 is thereby reduced. For instance, the second amplifier B 108 can provide one part of the load current $I_L$ while the third amplifier C1 440 through the n-th amplifier Cn 442 can provide the remaining part of the load current. In this way the second amplifier B 108 can operate with higher gain at heavier loads; therefore, the composite amplifier 400 can offer low distortion at higher current levels compared to the composite amplifier 200 of FIG. 2. The resistors RB0, RB1, through RBn can support a voltage and improve the current sharing among the second amplifier B 108 with the third amplifier C1 440 through the n-th amplifier Cn 442.

Although the composite amplifier 400 of FIG. 4A shows the third amplifier C1 440 through the n-th amplifier Cn 442 connected in parallel; in general more than two parallel buffers can be included between the third amplifier C1 440 through the n-th amplifier Cn 442, and the number of amplifiers for the third amplifier C1 440 to the n-th amplifier Cn 442 can vary in a very broad range.

In other configurations, the amplifiers can be operational amplifiers (op-amps). For instance, the composite amplifier 400 can use a quad op-amp IC to realize the first amplifier A 106, the second amplifier B 108, the third amplifier C1 440, and the n-th amplifier Cn 442. In this way, a single IC with four op-amps can be a cost effective and space saving strategy for implementing the composite amplifier 400 on a compact printed circuit board (PCB).

Figure 4B:
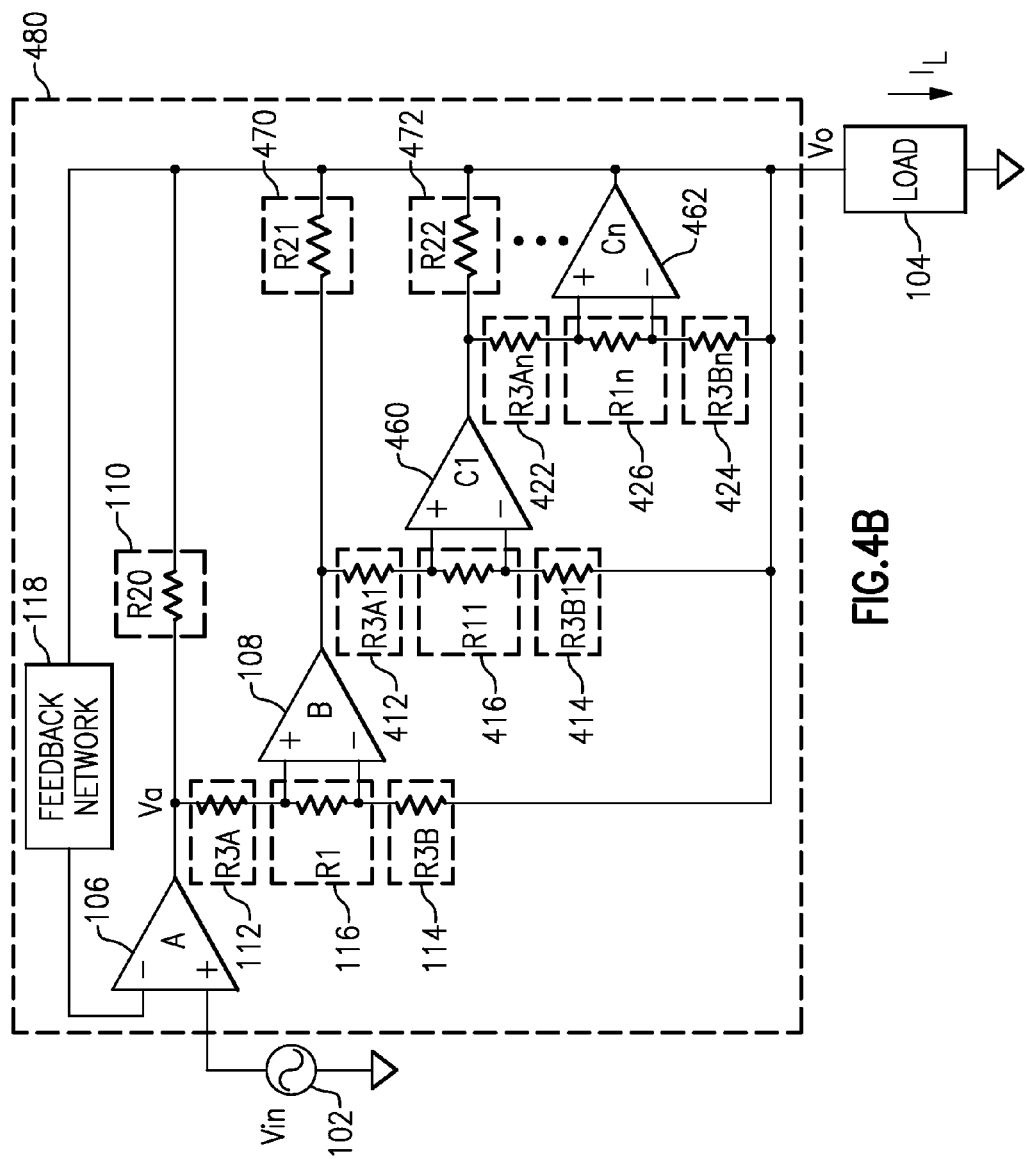
FIG. 4B is a schematic diagram of a composite amplifier according to another embodiment of the invention.

FIG. 4B is a schematic diagram of a composite amplifier 480 according to another embodiment of the invention. The composite amplifier 480 is similar to the composite amplifier 400 of FIG. 4A; however, the additional components and conductive paths are no longer configured as buffers. Instead, the additional amplifiers including a third amplifier C1 460 through a fourth amplifier Cn 462 are now connected similar to the second amplifier B 108. The connection of the third amplifier C1 460 at the output node of the second amplifier B 108 is similar to the connection of the second amplifier B 108 at the output node of the first amplifier A 106. For instance, the third amplifier C1 460 is connected within a local feedback loop with a seventh conductive path 412, an eighth conductive path 414, and a ninth conductive path 416 in the same manner as the second amplifier B 108 is connected within a local feedback loop with the third conductive path 112, the fourth conductive path 114, and the fifth conductive path 116. The same follows for the fourth amplifier Cn 462 with local feedback from an eleventh conductive path 422, a twelfth conductive path 424, and a thirteenth conductive path 426.

As discussed with respect to the composite amplifier of FIG. 2, the first conductive path 110 having a resistor R2 can operate as an electrically bootstrapped resistor R2 due to the error voltage from the noise gain of the second amplifier B 108. By analogy a sixth conductive path 470 electrically connected between the output of the second amplifier B 108 and the output node of the composite amplifier 480 and a tenth conductive path 472 electrically connected between the output of the third amplifier C1 460 and the output node of the composite amplifier 480 can operate as electrically bootstrapped resistors. For instance, the third amplifier C1 460 gives rise to an error voltage which is electrically bootstrapped across a resistor R21 of the sixth conductive path 470 while the fourth amplifier Cn 462 gives rise to an error voltage which is electrically bootstrapped across a resistor R22 of the tenth conductive path 472.

The additional amplifiers including the third amplifier C1 460 and the fourth amplifier Cn 462 can allow the composite amplifier 480 to have improved open loop gain, and thus lower distortion, at higher load currents compared to composite amplifiers having fewer amplifiers. For instance, when the first amplifier A 106, the second amplifier B 108, the third amplifier C1 460, and the fourth amplifier Cn 462 are matched op-amps from a quad op-amp IC, then the composite amplifier 480 can operate with low-distortion up to almost four times the current limit of each individual op-amp. Compared to the composite amplifier 100 and the composite amplifier 150 of FIGS. 1A and 1C, each additional amplifier and bootstrap resistor extends the range of low-distortion operation by an amount approximately equal to the current limit, also referred to as current capability, of the individual amplifier. For instance, the first amplifier A 106 with the second amplifier B 108 can be configured to provide low-distortion operation up to about twice the current capability while the third amplifier C1 460 and the fourth amplifier Cn 462 can improve or extend the low-distortion operation up to almost four times.

Figure 5:
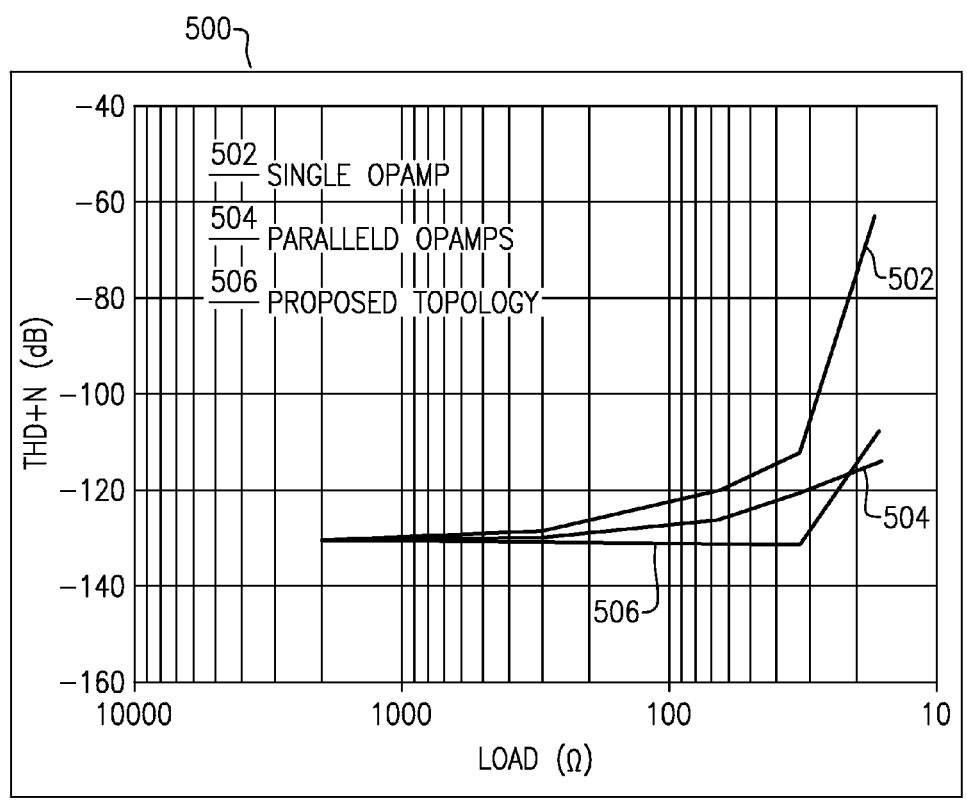
FIG. 5 is a plot of distortion vs. load resistance according to an embodiment of the invention.

FIG. 5 is a plot of test results of distortion vs. load resistance 500 according to an embodiment of the invention. FIG. 5 compares three op-amp application designs using the dual op-amp ADA4841-2 vs. the load in ohms. Because the load current is inversely proportional to the load resistance, the horizontal axis can also represent the load current increasing from left to right with the load resistance decreasing from 10K ohms to 10 ohms. Also, each of the three curves represents measurements performed on one of the three application designs and is referred to as an "application design". In the first application design 502, only a single op-amp from the dual package is used as a follower to provide a relationship similar to Equation 1. In the second application design 504, both op-amps are each used as a follower similar to that of the first design and the output of each amplifier is placed in a parallel configuration to share the burden of the load current. In the third application design 506, both op-amps are configured similar to the embodiment shown in FIG. 2.

At load resistances greater than 500 ohms, the application designs 502-506 have similar distortion characteristics with a total harmonic distortion plus noise of about −130 dB. As the load decreases (from about 300 ohms) and the load current $I_L$ increases, both the first application design 502 and the second application design 504 begin to exhibit higher distortion as the closed loop gain becomes strongly dependent on the amplifier open loop gain. Because it has two amplifiers in parallel sharing the burden of the load, the second application design 504 has slightly better distortion characteristics than the first application design 502. However, in both the first application design 502 and the second application design 504, the distortion begins to increase when the load is about 300 ohms because the closed loop gain begins to become strongly dependent upon amplifier open loop gain. By comparison, the third application design 506, corresponding to an example of a disclosed embodiment, maintains superior low distortion characteristics (−130 dB) as the load decreases to about 30 ohms. Thus, as shown in FIG. 5, the composite amplifier can extend the low-distortion operation to loads demanding load current greater than the current limit of an individual amplifier.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, a portable audio device, an MP3 player, a smartphone, a mobile phone, a powered headphone, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims. Current rating can be defined by design and by specification.

What is claimed is:

1. An apparatus comprising:
   a first amplifier;
   a second amplifier having a non-inverting input node and an inverting input node;
   a first conductive path configured to connect an output of the first amplifier to an output node, wherein the first amplifier is configured to provide a first current to a load connected at the output node;
   a second conductive path configured to connect an output of the second amplifier to the output node, wherein the second amplifier is configured to provide a second current to the load, and wherein an impedance of the first conductive path differs from an impedance of the second conductive path such that the second current is greater than the first current;
   a third conductive path configured to provide at least a portion of the output of the first amplifier as an input to the non-inverting input node of the second amplifier;
   a fourth conductive path configured to provide a voltage based on a voltage of the output node as an input to the inverting input node of the second amplifier; and
   a fifth conductive path configured to provide conductance between the non-inverting input and the inverting input of the second amplifier, wherein the fifth conductive path comprises at least one passive component.

2. The apparatus of claim 1, further comprising an integrated circuit, wherein the first amplifier and the second amplifier comprise identical instances of an operational amplifier, wherein both the first amplifier and the second amplifier are part of the integrated circuit.

3. The apparatus of claim 1, wherein the fifth conductive path comprises at least one resistor.

4. The apparatus of claim 1, wherein each of the first conductive path, the second conductive path, the third conductive path, the fourth conductive path, and the fifth conductive path, comprises at least one resistor, wherein a resistance of the fifth conductive path is less than a combined resistance of the third conductive path and the fourth conductive path.

5. The apparatus of claim 1, wherein each of the first conductive path, the second conductive path, the fourth conductive path, and the fifth conductive path, comprises at least one resistor, wherein a resistance of the fifth conductive path is less than a resistance of the fourth conductive path.

6. The apparatus of claim 1, wherein each of the first conductive path, the second conductive path, the third conductive path, and the fifth conductive path, comprises at least one resistor, wherein a resistance of the fifth conductive path is less than a resistance of the third conductive path.

7. The apparatus of claim 1, wherein at least one of the third conductive path or the fourth conductive path comprises an impedance element that is not a short circuit.

8. The apparatus of claim 1, further comprising a feedback network configured to determine a closed-loop gain characteristic.

9. The apparatus of claim 8:
   wherein the first amplifier is further configured to provide an error current at the output node of the first amplifier;

wherein the second amplifier is further configured to provide a buffer current at the output node of the second amplifier; and wherein the first and second amplifiers are configured to provide a load current to the load electrically connected to the output node of the second amplifier.

10. The apparatus of claim 9 wherein the feedback network is configured to provide shunt feedback.

11. The apparatus of claim 10 wherein the feedback network is configured to provide a closed loop gain less than or equal to one.

12. The apparatus of claim 1, wherein the apparatus comprises an audio device, wherein the first amplifier and the second amplifier are configured to drive an audio transducer.

13. A method of paralleling amplifiers, the method comprising:

providing at least a portion of an output signal of a first amplifier to a non-inverting input of a second amplifier;

providing a first output current from the first amplifier to a load through a first conductive path;

providing a second output current from the second amplifier to the load through a second conductive path, wherein an impedance of the first conductive path is greater than an impedance of the second conductive path, and wherein the second output current is greater than the first output current;

combining an output of a first amplifier and an output of a second amplifier to generate an output signal at an output node; and passively conducting current between the non-inverting input of the second amplifier and an inverting input of the second amplifier.

14. The method of claim 13, wherein the first amplifier and the second amplifier comprise identical instances of an operational amplifier, wherein both the first amplifier and the second amplifier are part of an integrated circuit.

15. The method of claim 13, further comprising passively conducting current with at least one resistor.

16. The method of claim 13, further comprising passively conducting current with a first conductive path, a second conductive path, a third conductive path, a fourth conductive path, and a fifth conductive path, comprises at least one resistor, wherein a resistance of the fifth conductive path is less than a combined resistance of the third conductive path and the fourth conductive path.

17. The method of claim 13, wherein a first resistance associated with passively conducting current between the non-inverting input of the second amplifier and the inverting input of the second amplifier is less than a combined resistance of a first path and a second path, wherein the first path is between the output of the first amplifier and the non-inverting input node of the second amplifier and wherein the second path is between the output of the second amplifier and the inverting input node of the second amplifier.

18. The method of claim 13, wherein a first resistance associated with passively conducting current between the non-inverting input of the second amplifier and the inverting input of the second amplifier is less than a resistance of a path between the output of the first amplifier and the non-inverting input node of the second amplifier.

19. The method of claim 13, wherein a first resistance associated with passively conducting current between the non-inverting input of the second amplifier and the inverting input of the second amplifier is less than a resistance of a path between the output of the second amplifier and the inverting input node of the second amplifier.

20. The method of claim 13, further comprising driving an audio transducer with the first amplifier and the second amplifier.

* * * * *